(12) United States Patent
Kurita (10) Patent No.: US 9,281,591 B2
(45) Date of Patent: Mar. 8, 2016

(54) CONTACT MEMBER

(71) Applicant: KITAGAWA INDUSTRIES CO., LTD., Aichi (JP)

(72) Inventor: Tomohisa Kurita, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days.

(21) Appl. No.: 14/424,705

(22) PCT Filed: Sep. 25, 2013

(86) PCT No.: PCT/JP2013/075912
§ 371 (c)(1),
(2) Date: Feb. 27, 2015

(87) PCT Pub. No.: WO2014/050888
PCT Pub. Date: Apr. 3, 2014

(65) Prior Publication Data
US 2015/0222035 A1 Aug. 6, 2015

(30) Foreign Application Priority Data
Sep. 28, 2012 (JP) ................................. 2012-216437

(51) Int. Cl.
*H01R 4/02* (2006.01)
*H01R 12/72* (2011.01)
(Continued)

(52) U.S. Cl.
CPC .............. *H01R 12/724* (2013.01); *H01B 5/002* (2013.01); *H01R 4/02* (2013.01); *H01R 12/57* (2013.01);
(Continued)

(58) Field of Classification Search
CPC ............................. H01R 13/115; H01R 12/57

USPC .................. 439/849, 852, 850, 854, 862, 876
See application file for complete search history.

(56) References Cited

U.S. PATENT DOCUMENTS

| 3,363,224 A * | 1/1968 | Gluntz .................. H01R 13/11 439/852 |
| 2003/0054684 A1* | 3/2003 | Yamanashi .......... H01R 4/2466 439/397 |
| 2004/0245886 A1* | 12/2004 | Uchida .................. H01R 39/59 310/239 |

FOREIGN PATENT DOCUMENTS

| JP | 2000-156588 A | 6/2000 |
| JP | 2011-100885 A | 5/2011 |

(Continued)

OTHER PUBLICATIONS

Form PCT/ISA/210 International Search Report for PCT/JP2013/075912 mailed Dec. 10, 2013.
(Continued)

*Primary Examiner* — Phuongchi T Nguyen
(74) *Attorney, Agent, or Firm* — Koppel, Patrick, Heybl & Philpott (57) ABSTRACT

A contact member has a first flat-plate portion, a pair of leg portions, a second flat-plate portion, and a projection portion. The pair of leg portions extends from opposite ends of the first flat-plate portion along a first orientation in a direction intersecting with the first flat-plate portion. The second flat-plate portion is connected to a projecting end of the leg portion. The projection portion extends from an end of the first flat-plate portion on a first direction side of a second orientation, which intersects with the first orientation, to the same direction as the direction where the leg portion extends. The projection portion is bent in a second direction of the second orientation to pass through the space between the pair of leg portions, thereby projecting in the second direction of the second orientation. The projection portion is provided with a protruding portion that expands along the first orientation.

4 Claims, 5 Drawing Sheets

(51) Int. Cl.
*H05K 9/00* (2006.01)
*H01B 5/00* (2006.01)
*H01R 13/24* (2006.01)
*H05K 7/14* (2006.01)
*H01R 12/57* (2011.01)
*H01R 12/71* (2011.01)

(52) U.S. Cl.
CPC .......... *H01R 12/718* (2013.01); *H01R 13/2407* (2013.01); *H05K 7/142* (2013.01); *H05K 9/0016* (2013.01)

(56) References Cited

FOREIGN PATENT DOCUMENTS

| JP | 2011-049387 A | 10/2011 |
| JP | 2011-096908 A | 12/2011 |

OTHER PUBLICATIONS

Translations of the International Preliminary Report on Patentability from corresponding PCT application No. PCT/JP2013/075912, dated Apr. 9, 2015.

\* cited by examiner

CONTACT MEMBER

CROSS-REFERENCE TO RELATED APPLICATION

This application claims priority from Japanese Patent Application No. 2012-216437 filed with the Japan Patent Office on Sep. 28, 2012, the entire content of which is hereby incorporated by reference.

TECHNICAL FIELD

The present invention relates to a contact member that is surface-mounted on a printed board by an automatic mounting machine and is in contact with a casing and the like to electrically connect between the printed board and the casing.

BACKGROUND ART

A contact member that is surface-mounted on a printed board as below has been suggested (see Patent Document 1). In this contact member, an end part thereof that is brought into contact with a casing or the like is elastically displaced in a direction parallel to a surface of the printed board where the contact member is to be mounted. By the use of the contact member as above, the electrical conduction can be achieved between the printed board and the contact surface of the casing extending in the direction intersecting with the mount surface of the printed board.

PRIOR ART DOCUMENTS

Patent Documents

PATENT DOCUMENT 1: JP-A-2011-96908

SUMMARY OF INVENTION

Problems to be Solved by the Invention

The contact member according to Patent Literature 1 includes two components: a base component and an elastic component. Only a part (spring part) of the elastic component is elastically displaced, while the base component is not elastically displaced largely. Therefore, the movable range of the spring part is limited to the range where the deformation of the spring part itself is possible. This is the reason why it has been difficult to widen the movable range. If the movable range is not sufficient, the damage is likely to occur; for example, when the spring part is brought into strong contact with the casing or other components, the spring part is bent to be broken or lose its spring property.

According to an aspect of the present invention, a contact member that can inhibit the damage is desirably provided.

Solutions to the Problems

An aspect of the present invention is a contact member that is surface-mounted on a mounting object. This contact member includes a single metal plate having electrical conductivity and elasticity. This contact member includes a first flat-plate portion, a pair of leg portions, second flat-plate portions, and a projection portion. The pair of leg portions extends from respective ends of the first flat-plate portion on a first direction side and on a second direction side of a first orientation in the first flat-plate portion in a direction intersecting with the first flat-plate portion. The second flat-plate portions are connected to the extending ends of the leg portions and are disposed in parallel to the first flat-plate portion. The projection portion extends from an end of the first flat-plate portion on the first direction side of a second orientation, which intersects with the first orientation in the first flat-plate portion, in the same direction as the direction where the leg portions extend. The projection portion is bent in the second direction of the second orientation, and projects in the second direction of the second orientation through the space between the pair of leg portions. The projection portion is provided with protruding portions that expand along the first orientation. When the projection portion is displaced in the second direction of the second orientation, the expansion portions are locked by the leg portions.

By having the projection portion, which projects through the space between the pair of leg portions, in contact with the casing or the like disposed in a projection direction, the contact member structured as above can achieve the electrical conduction between the casing and the mounting object.

The projection portion in the contact member according to the present invention is displaced when the load is applied from the outside in the first direction of the second orientation. On this occasion, the projection portion can be displaced widely using the region from the connection area between the projection portion and the first flat-plate portion in the area to which the load is applied. In other words, the projection portion can be displaced widely using the region of the projection portion extending from the connection area to the same direction as the direction where the leg portions extend and the region projecting in the second direction side of the second orientation.

Therefore, the movable range, which is the range where the projection portion can be displaced without being damaged, can be increased. As a result, even when the load is applied from the outside to cause the large displacement, the projection portion is unlikely to be damaged. Moreover, when the projection portion is displaced in the second direction of the second orientation, the expansion portions are locked by the leg portions. Therefore, the displacement of the projection portion in the second direction of the second orientation is inhibited. Therefore, it is possible to inhibit the deformation of the projection portion because of being pulled out in the second direction of the second orientation.

In this manner, the movable range of the projection portion is wide in the contact member of the present invention. Moreover, the expansion portions inhibit the aforementioned deformation of the projection portion because of being pulled out in the second direction of the second orientation. Thus, the damage of the projection portion can be inhibited.

The contact member of the present invention includes a single metal plate. The structure of the present invention except the first flat-plate portion, the leg portions, the second flat-plate portions, the projection portion, and the expansion portions may not be formed of a single metal plate but may be attached as separate components.

The aforementioned contact member may have the space between the expansion portion and the leg portion, and may be structured so that when the projection portion is displaced in the second direction of the second orientation to displace the expansion portion in the second direction of the second orientation by a predetermined amount, the expansion portion is brought into contact with the leg portion to be locked by the leg portion.

In the contact member structured as above, when the projection portion is pulled out in the second direction of the second orientation, the projection portion is displaced in the second direction of the second orientation until the expansion portion is locked by the leg portion. The projection portion is connected to the first flat-plate portion. Therefore, the projection portion is displaced to rotate around the connection area. Thus, when the projection portion is hung by something and pulled out in the second direction of the second orientation, the inclination angle of the projecting end of the projection portion, the position of the projection portion related to the direction other than on the second orientation, and so on change. As a result, the connection between the projection portion and something that pulls out the projection portion in the second direction of the second orientation is easily released. This makes it difficult to pull out the projection portion, thereby inhibiting the damage of the projection portion.

The end of the projection portion of the aforementioned contact member that projects in the second direction of the second orientation may be folded back in the first direction of the second orientation. In this case, the leg portions or the first flat-plate portion may be provided with restriction portions. By having this restriction portion locked by a locking piece provided to the folded-back end of the projection portion, the movement of the end of the projection portion in the second direction of the second orientation can be inhibited.

In the contact member structured as above, locking the restriction portion with the locking piece can inhibit the displacement of the projection portion in the second direction of the second orientation. For this reason, it is possible to inhibit that the projection portion is pulled out in the second direction of the second orientation and damaged.

BRIEF DESCRIPTION OF THE DRAWINGS

FIG. 1A to FIG. 1I are diagrams each illustrating a contact member according to an embodiment: FIG. 1 is a perspective view seen from the lower right side.

DESCRIPTION OF REFERENCE SIGNS

1 Contact member
3 Board
5 Casing
11 First flat-plate portion
13a, 13b Leg portion
15a, 15b Second flat-plate portion
17a, 17b Restriction portion
21 Extension portion
23 Projection portion
25a, 25b Protruding portion
31 Bottom portion
33 Inclined portion
35 Bent portion
37 Locking piece
41 Projection portion
43 Folded-back portion
45 Locking piece

DESCRIPTION OF EMBODIMENTS

An embodiment of the present invention is hereinafter described with reference to the drawings.

Example (1) Overall Structure

A contact member 1 of this example is a contact member that is surface-mounted on a mounting object. The contact member 1 includes a single metal plate having electrical conductivity and elasticity. A specific configuration thereof is described with reference to FIG. 1A to FIG. 1I.

In the contact member 1, a base portion configured to be relatively less susceptible to elastic displacement when being bent is connected to a movable portion that is easily elastically-displaced. The aforementioned base portion includes a first flat-plate portion 11, a pair of leg portions 13a and 13b, and a pair of second flat-plate portions 15a and 15b. The base portion has a cylindrical shape with a rectangular section as a whole. The aforementioned movable portion corresponds to a projection portion 23.

The first flat-plate portion 11 has a rectangular plate-like shape. The leg portions 13a and 13b are plate-like portions. The leg portions 13a and 13b extend in parallel to each other in a direction orthogonal to the first flat-plate portion 11 at opposite ends of the first flat-plate portion 11 along a first orientation. (The first orientation corresponds to the C-D direction in FIG. 1B to FIG. 1E. In the description below, the direction may be denoted by C or D. The C direction is an example of the first direction of the first orientation in the present invention. The D direction is an example of the second direction of the first orientation in the present invention.) The direction where the leg portions 13a and 13b extend from the first flat-plate portion 11 is not limited to the direction orthogonal to the first flat-plate portion 11 but may be the direction intersecting with the first flat-plate portion 11.

The second flat-plate portions 15a and 15b are plate-like portions that are connected to the extending ends of the leg portions 13a and 13b, respectively, and that are disposed in parallel to the first flat-plate portion 11. The second flat-plate portion 15a extends in the second flat-plate portion 15b, and the second flat-plate portion 15b extends in the second flat-plate portion 15a. The second flat-plate portions 15a and 15b are positioned on the same plane.

Restriction portions 17a and 17b are provided at the ends of the leg portions 13a and 13b in the second direction (an A direction) of the second orientation that intersects with the C-D direction. (The second orientation corresponds to the A-B direction in FIG. 1A, FIG. 1D, and FIG. 1E. In the description below, the direction may be denoted by A or B. The B direction is an example of the first direction of the second orientation in the present invention. The A direction is an example of the second direction of the second orientation in the present invention.) The restriction portions 17a and 17b mutually extend toward the counterparts thereof, and are positioned in the same plane.

The projection portion 23 is connected to the end of the first flat-plate portion 11 in the B direction, and extends in the direction toward the second flat-plate portions 15a and 15b. The end of the projection portion 23 enters from the B direction side into the space between the pair of leg portions 13a and 13b to pass therethrough, thereby projecting in the A direction.

The projection portion 23 has an extension portion 21. The extension portion 21 is a portion with a plate-like shape of the aforementioned projection portion 23 that extends from the connection area of the first flat-plate portion 11 toward the second flat-plate portions 15a and 15b. The extension portion 21 is provided with protruding portions 25a and 25b that expand outward in the C-D direction. The extension portion 21 including the expansion portions 25a and 25b is spaced apart from the leg portions 13a and 13b in the A-B direction.

The projection portion 23 includes a bottom portion 31, an inclined portion 33, a folded-back portion 35, and a locking piece 37. When the second flat-plate portions 15a and 15b are the lower end of the contact member 1 and the first flat-plate portion 11 is the upper end of the contact member 1, the bottom portion 31 corresponds to the part of the projection portion 23 that extends in the A direction along the second flat-plate portions 15a and 15b from the end (lower end) of the extension portion 21 on the second flat-plate portions 15a and 15b side.

The inclined portion 33 is the part of the projection portion 23 that is inclined from the end of the bottom portion 31 in the A direction and in the upward direction. The folded-back portion 35 is the part of the projection portion 23 that is folded back in the B direction from the end of the inclined portion 33.

The locking piece 37 is the part of the projection portion 23 that is connected to the end of the folded-back portion 35 and bent downward. The folded-back portion 35 is formed to have the width in the C-D direction that is narrower than that of the inclined portion 33. The locking piece 37 is formed to have the width in the C-D direction that is larger than that of the folded-back portion 35 and have the width equivalent to that of the inclined portion 33. The inclination angle of the inclined portion 33 from the A-B direction is larger than that of the folded-back portion 35. The angle of the folded-back portion 35 is the angle that is closer to be parallel to the A-B direction.

Figure 1A:
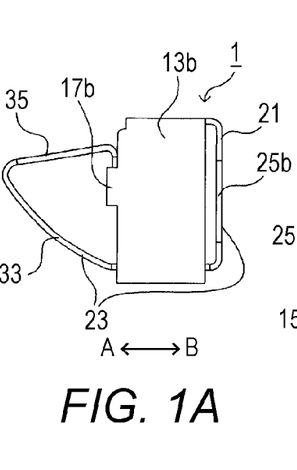
FIG. 1A is a front view.
Figure 1B:
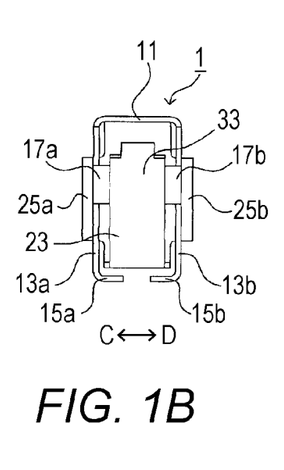
FIG. 1B is a left-side view.
Figure 1C:
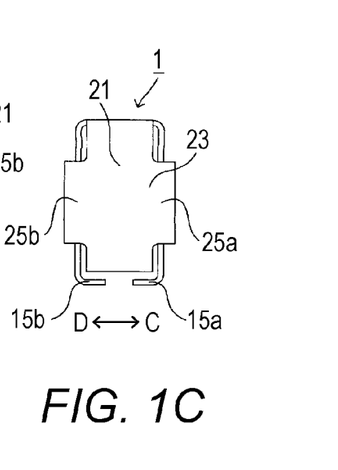
FIG. 1C is a right-side view.
Figure 1D:
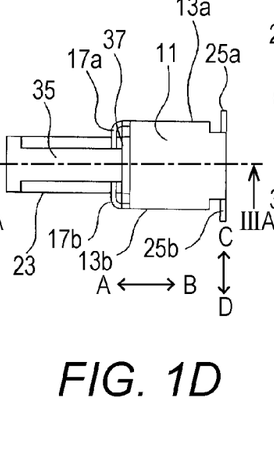
FIG. 1D is a plan view.
Figure 1E:
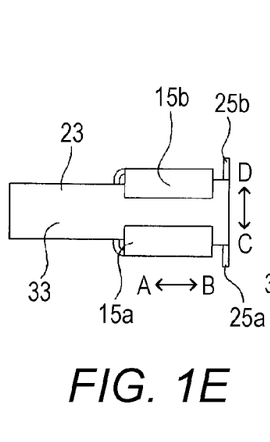
FIG. 1E is a bottom view.
Figure 1F:
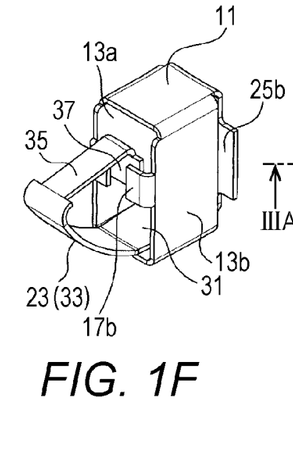
FIG. 1F is a perspective view seen from the upper left side.
Figure 1G:
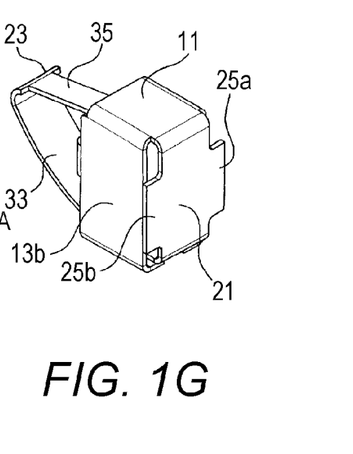
FIG. 1G is a perspective view seen from the upper right side.
Figure 1H:
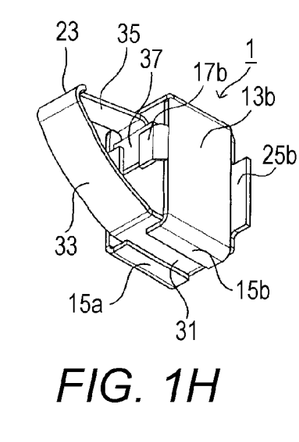
FIG. 1H is a perspective view seen from the lower left side.
Figure 1I:
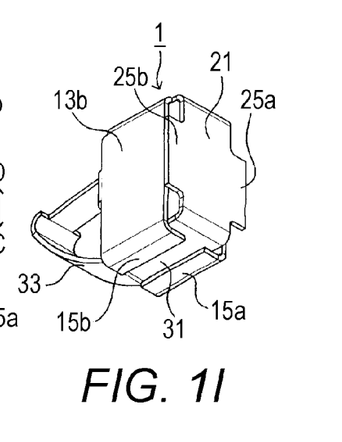

As is clear such as from FIG. 1B and FIG. 1C, the contact member 1 has a symmetrical shape along the C-D direction.

(2) Operation and Effect

Figure 2A:
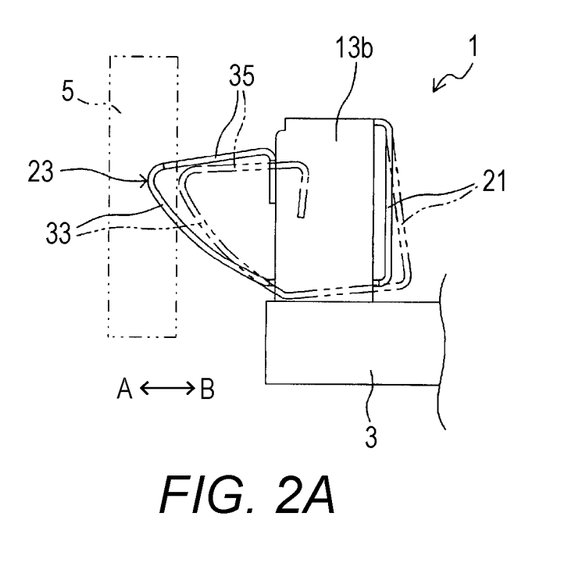
FIG. 2A is a front view illustrating a state in which the contact member according to an embodiment is mounted on a board and FIG. 2B is a front view illustrating a state in which a casing approaches from below.

FIG. 2A depicts the state in which the contact member 1 is attached to the board 3 by soldering the second flat-plate portions 15a and 15b of the contact member 1 with solder (that is not illustrated). The contact member 1 is surface-mounted by an automatic mounting machine and fixed by solder in a predetermined region that is electrically connected with a printed wiring board, which is not illustrated, on the board 3. By bringing the projection portion 23 into contact with the casing 5 in this state, the board 3 and the casing 5 are electrically connected to each other.

The projection portion 23 can be elastically displaced in the A-B direction. When the load from the outside to the B direction acts on the projection portion 23 such as because the projection portion 23 is brought into contact with the casing 5, the projection portion 23 is displaced in the B direction as a whole. The contact member 1 illustrated with the solid line in FIG. 2A is in the state before the contact member 1 is brought into contact with the casing 5. The contact member 1 illustrated the two-dot chain line is in the state where the contact member 1 is in contact with the casing 5.

On this occasion, the projection portion 23 presses the casing 5 in the A direction with the elastic force. This maintains the favorable contact between the casing 5 and the projection portion 23. When the projection portion 23 is detached from the casing 5, the projection portion 23 returns to the original position (position illustrated with the solid line) with the elastic force.

Figure 2B:
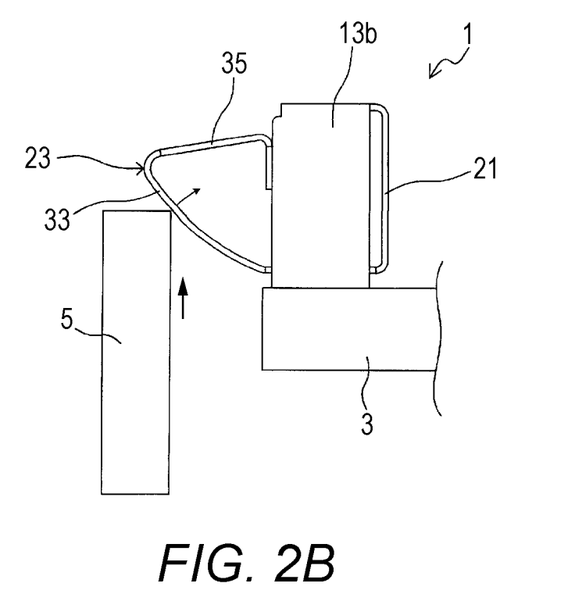

As depicted in FIG. 2B, when the casing 5 rises from the downward direction relatively to get closer to the projection portion 23, the upper end of the casing 5 slides on the surface of the inclined portion 33 to move upward while pressing the inclined portion 33 in the B direction. The casing 5 and the projection portion 23 come to the position indicated by the two-dot chain line in FIG. 2A.

The projection portion 23 has elasticity. When the load is applied from the casing 5 in the B direction as aforementioned, the projection portion 23 is displaced from the area where the projection portion 23 is connected to the first flat-plate portion 11. This can increase the movable range largely. In other words, even when the load is applied from the outside to cause large deformation, the projection portion 23 is not damaged easily.

Figure 3A:
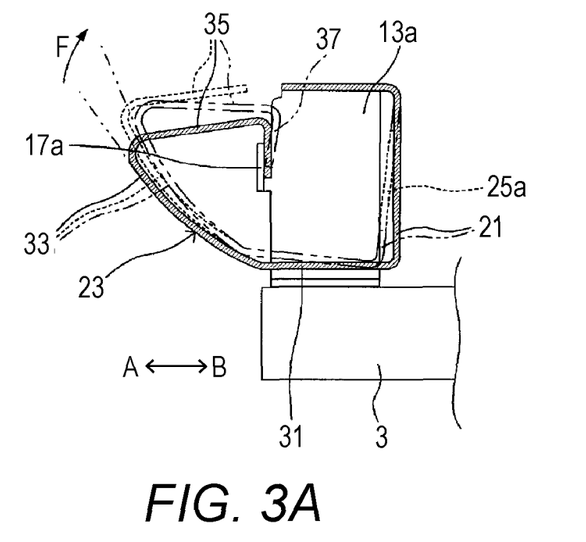
FIG. 3A is a sectional view along IIIA-IIIA of FIG. 1D.
Figure 3B:
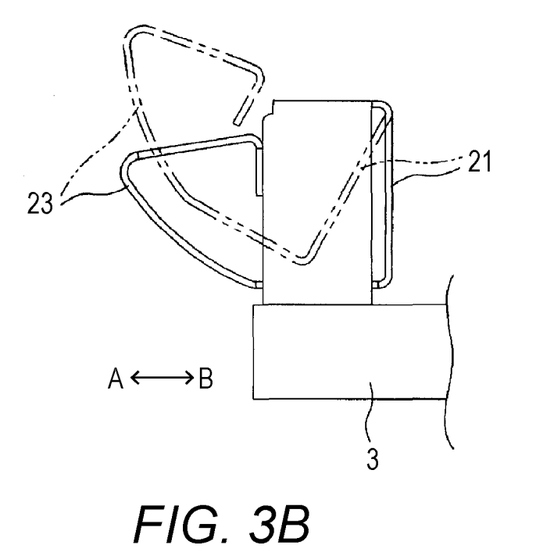
FIG. 3B is a front view of a reference example in the absence of the expansion portions and the restriction portions.

When the projection portion 23 is hung by something such as a finger of a person or the casing 5 to be pulled out in the A direction, the expansion portion 25a is locked by the leg portion 13a as illustrated with the two-dot chain line in FIG. 3A. Thus, the further displacement of the projection portion 23 in the A direction is inhibited. Although not illustrated, this similarly applies to the expansion portion 25b and the leg portion 13b. Therefore, as depicted in FIG. 3B, the deformation of the projection portion 23 because of being pulled out largely in the A direction can be inhibited.

Moreover, when the projection portion 23 is pulled out in the A direction, the locking piece 37 is locked by the restriction portions 17a and 17b. This can also inhibit the displacement of the projection portion 23 in the A direction. Thus, the damage of the projection portion 23 can be inhibited.

When the load that pulls out the projection portion 23 in the A direction is applied to the projection portion 23, the expansion portions 25a and 25b are displaced by a predetermined amount in the A direction to be brought into contact with the leg portions 13a and 13b. The extension portion 21 is displaced in the A direction until the expansion portions 25a and 25b are locked by the leg portions 13a and 13b. The extension portion 21 is connected to the first flat-plate portion 11. Therefore, the extension portion 21 is displaced so as to rotate around that portion. As a result, the lower end side of the extension portion 21 is displaced, whereby the extension portion 21 is in the inclined state.

As a result, the projection portion 23 is displaced largely as indicated by the arrow F in FIG. 3A. Specifically, as compared with the case in which just the part of the projection portion that extends externally from the bottom portion 31 is displaced, the projecting end of the projection portion 23 is moved upward. Moreover, the inclination angle of the inclined portion 33 related to the vertical direction is increased.

Therefore, even though there is an article that applies the load pulling out the projection portion 23 in the A direction, the connection between the article and the projection portion 23 is easily released. Accordingly, the damage of the projection portion 23 can be inhibited. In particular, as for the article that is in contact with the inclined portion 33 from the downward direction, since the inclination angle of the inclined portion 33 is large, the connection is easily released.

When the projection portion 23 has moved in the A direction, the locking piece 37 is locked by the restriction portions 17a and 17b. Therefore, the lower end of the inclined portion 33 is more displaced in the A direction than the upper end thereof. As a result, the change of the aforementioned inclination angle becomes larger. This is convenient because the effect of releasing the connection between the projection portion 23 and the article that applies the load pulling out the projection portion 23 in the A direction is easily obtained.

The folded-back portion 35 extends in the A-B direction. This can inhibit the entry of foreign substances into the region between the leg portions 13a and 13b and to the inside of the inclined portion 33 (in the B direction). Thus, the displacement of the projection portion 23 due to the entry of the foreign substances can be inhibited.

The locking piece 37 is formed widely in a manner similar to the inclined portion 33. Therefore, the range where the locking piece 37 can be displaced in the C-D direction is narrow. Thus, the displacement of the end of the projection portion 23 in the C-D direction when the load in the C-D direction is applied to the projection portion 23 can be inhibited.

Moreover, the contact member 1 can be mounted by the solder on the board 3 by using not only the second flat-plate portions 15a and 15b but also the first flat-plate portion 11. Thus, the more appropriate bonding plane for the casing 5 can be selected to carry out the mounting.

For example, in the case where the contact member 1 is mounted as illustrated in FIG. 2A, the inclined portion 33 extends in the A direction and upward. Therefore, when the casing 5 gets close to the contact member 1 from the downward direction or the A direction side relatively, the projection portion 23 is displaced to the position illustrated with the two-dot chain line smoothly. When the casing 5 gets closer to the contact member 1 from the upward direction, on the contrary, the contact with the inclined portion 33 does not occur. Therefore, as compared with the case in which the casing 5 gets closer from the downward direction, the smooth movement is difficult.

In that case, therefore, the contact member 1 is reversed upside down to make the first flat-plate portion 11 serve as the solder plane; thus, the contact member 1 is mounted on the board 3. This makes the inclined portion 33 face upward. Therefore, when the casing 5 gets closer from the upward direction, the contact member 1 can be displaced to the position illustrated with the dashed line smoothly.

In the mounting on the board 3 through the soldering to the second flat-plate portions 15a and 15b, the first flat-plate portion 11 can be used as the suction plane of a suction nozzle of the automatic mounting machine. When the first flat-plate portion 11 is soldered, the second flat-plate portions 15a and 15b can be used as the suction plane.

As illustrated in FIG. 1A, the inclined portion 33 and the folded-back portion 35 of the contact member 1 have the different inclination angles in the A-B direction. The folded-back portion 35 is narrower than the inclined portion 33 in the C-D direction. Therefore, it is easy to check whether the vertical direction of the contact member 1 is correct or not with a sensor or eyes. Thus, for example, when the contact member 1 is housed in an embossed carrier tape or after the contact member 1 is housed in the embossed carrier tape, the erroneous housing direction can be easily found.

Modified Example

The example of the present invention has been described as above. The present invention is, however, not limited thereto. Needless to say, various modes can be employed within the technical scope of the present invention.

For example, the above example has described the structure in which the expansion portions 25a and 25b are locked by the leg portions 13a and 13b and the locking piece 37 is locked by the restriction portions 17a and 17b for inhibiting the projection portion 23 from being pulled in the A direction. Another structure is also possible in which the locking piece 37 and the restriction portions 17a and 17b are not provided and just the expansion portions 25a and 25b and the leg portions 13a and 13b inhibit the aforementioned pulling out in the A direction.

Figure 4A:
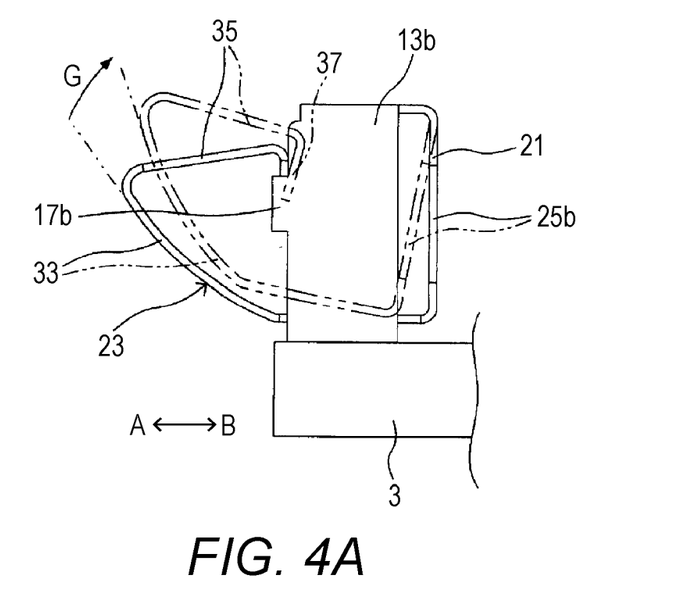
FIG. 4A and FIG. 4B are front views each illustrating a contact member of a modified example.

In this case, the displacement of the projection portion 23 in the A direction is inhibited by having the expansion portions 25a and 25b locked by the leg portions 13a and 13b as illustrated with the dashed line in FIG. 3A. The space between the expansion portions 25a and 25b and the leg portions 13a and 13b may be reduced or omitted. Even in this case, the extension portion 21 can be displaced in the B direction. Accordingly, the amount of the displacement of the projection portion 23 in the B direction can be increased. On the other hand, as illustrated in FIG. 4A, when the space is increased, the change of the inclination angle (arrow G) when the projection portion 23 is pulled out in the A direction can be increased.

Figure 5:
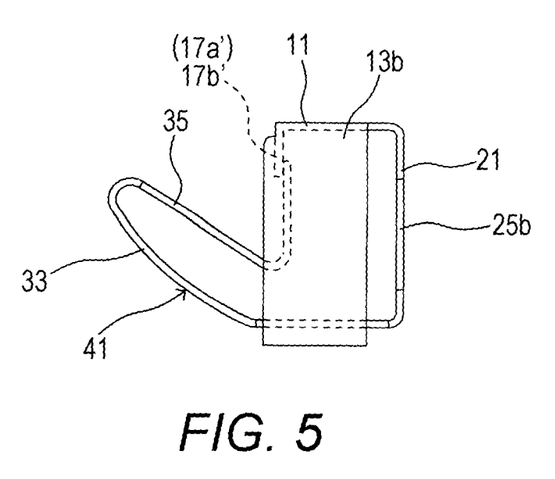
FIG. 5 is a front view illustrating another modified example.

In the above example, the restriction portions 17a and 17b are provided for the leg portions 13a and 13b. As depicted in FIG. 5, a restriction portion 17b' (17a') may be also connected to extend in the downward direction from the end of the first flat-plate portion 11 in the A direction.

Figure 4B:
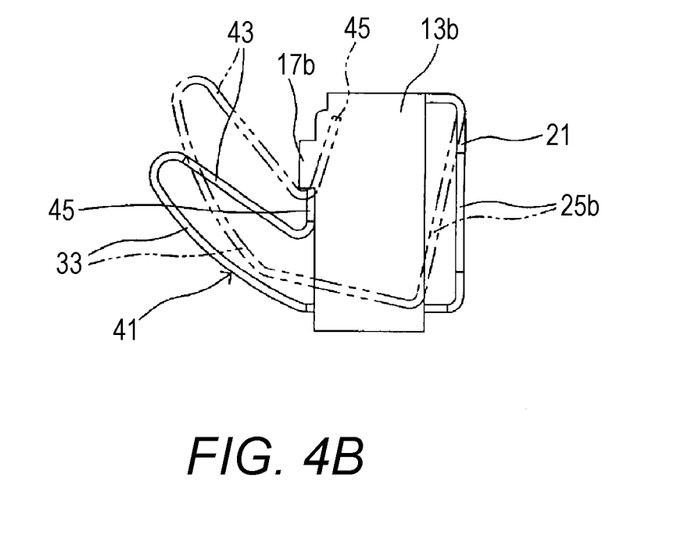

In the above example, the structure has been described in which the locking piece 37 is bent from the end of the folded-back portion 35 to the downward direction and connected. However, another structure of a projection portion 41 illustrated in FIG. 4B is also possible in which a locking piece 45 is bent in the upward direction. In this case, when the projection portion 41 is pulled out in the upward direction, the restriction portions 17a and 17b are locked by the locking piece 45 firmly. Therefore, the displacement in the upward direction can be inhibited more effectively. When a folded-back portion 43 is inclined downward as illustrated in FIG. 4B, the entire can be formed to be small.

Another structure is also possible in which the expansion portion is provided for only one of the pair of leg portions 13a and 13b.

The invention claimed is:

1. A contact member configured to be surface-mounted on a mounting object, including single metal plate having electrical conductivity and elasticity, the contact member comprising:
   a first flat-plate portion;
   a pair of leg portions extending from respective ends of the first flat-plate portion on a first direction side and on a second direction side of a first orientation in the first flat-plate portion in a direction intersecting with the first flat-plate portion;
   a second flat-plate portion connected to an extending end of the leg portion and disposed in parallel to the first flat-plate portion; and
   a projection portion extending from an end of the first flat-plate portion on a first direction side of a second orientation, which intersects with the first orientation in the first flat-plate portion, in the same direction as the direction where the leg portion extends, and being bent in a second direction of the second orientation to pass through a space between the pair of leg portions, thereby projecting in the second direction of the second orientation, wherein:
   the projection portion is provided with a protruding portion that expands along the first orientation; and when the projection portion is displaced in the second direction of the second orientation, the expansion portion is locked by the leg portion.

2. The contact member according to claim 1, wherein:

a gap is provided between the protruding portion and the leg portion; and when the projection portion is displaced in the second direction of the second orientation to displace the protruding portion by a predetermined amount in the second direction of the second orientation, the protruding portion is brought into contact with the leg portion to be locked by the leg portion.

3. The contact member according to claim 2, wherein:

an end of the projection portion that projects in the second direction of the second orientation is folded back in the first direction of the second orientation and a locking piece is provided at the folded-back end; and the leg portion or the first flat-plate portion is provided with a restriction portion that inhibits movement of the end of the projection portion in the second direction of the second orientation by having the restriction portion locked by the locking piece.

4. The contact member according to claim 1, wherein:

an end of the projection portion that projects in the second direction of the second orientation is folded back in the first direction of the second orientation and a locking piece is provided at the folded-back end; and the leg portion or the first flat-plate portion is provided with a restriction portion that inhibits movement of the end of the projection portion in the second direction of the second orientation by having the restriction portion locked by the locking piece.

\* \* \* \* \*